US009007746B2

(12) United States Patent
Rajvanshi et al.

(10) Patent No.: US 9,007,746 B2
(45) Date of Patent: Apr. 14, 2015

(54) MODULAR DRAW OUT FAN MODULE WITH CHIMNEY DESIGN FOR COOLING COMPONENTS IN LOW VOLTAGE SWITCHGEAR

(71) Applicants: Rahul Rajvanshi, Irving, TX (US); Harry W. Josten, Grapevine, TX (US); James Keith Flowers, Euless, TX (US)

(72) Inventors: Rahul Rajvanshi, Irving, TX (US); Harry W. Josten, Grapevine, TX (US); James Keith Flowers, Euless, TX (US)

(73) Assignee: Siemens Industry, Inc., Alpharetta, GA (US)

( * ) Notice: Subject to any disclaimer, the term of this patent is extended or adjusted under 35 U.S.C. 154(b) by 204 days.

(21) Appl. No.: 13/711,716

(22) Filed: Dec. 12, 2012

(65) Prior Publication Data
US 2014/0160636 A1    Jun. 12, 2014

(51) Int. Cl.
*H02B 1/56*     (2006.01)
*H05K 7/20*     (2006.01)

(52) U.S. Cl.
CPC ............ *H02B 1/565* (2013.01); *H05K 7/20581* (2013.01)

(58) Field of Classification Search
USPC ......... 361/605, 608, 614, 634, 640, 652, 656, 361/676, 678, 679.46, 690, 695; 454/184, 454/185, 186; 165/80.2, 80.3, 104.33, 165/121–126, 185; 200/306, 400, 289; 174/50, 520, 17 VA
See application file for complete search history.

(56) References Cited

U.S. PATENT DOCUMENTS

| | | | | |
|---|---|---|---|---|
| 2,824,939 | A | * | 2/1958 | Claybourn et al. ............ 200/289 |
| 3,617,231 | A | * | 11/1971 | Fenstermacher et al. ..... 65/30.12 |
| 4,528,614 | A | * | 7/1985 | Shariff et al. .................. 361/678 |
| 5,124,881 | A | * | 6/1992 | Motoki .......................... 361/605 |
| 5,166,861 | A | * | 11/1992 | Krom ............................. 361/678 |
| 5,189,384 | A | * | 2/1993 | Milianowicz et al. .......... 335/16 |
| 5,193,049 | A | * | 3/1993 | Jackson ......................... 361/676 |
| 5,481,429 | A | * | 1/1996 | Eriksson et al. .............. 361/678 |
| 6,041,851 | A | * | 3/2000 | Diebel et al. ............. 165/104.33 |
| 6,067,223 | A | * | 5/2000 | Diebel et al. .................. 361/676 |
| 6,198,628 | B1 | * | 3/2001 | Smith ........................... 361/695 |
| 7,199,318 | B2 | * | 4/2007 | Buxton et al. ................ 200/306 |
| 7,586,738 | B1 | * | 9/2009 | Hartzel et al. ................ 361/676 |
| 7,821,774 | B2 | * | 10/2010 | Josten et al. .................. 361/605 |
| 7,974,078 | B2 | * | 7/2011 | Coomer et al. ............... 361/678 |
| 8,189,325 | B2 | * | 5/2012 | Kurogi et al. ................. 361/678 |
| 8,437,118 | B2 | * | 5/2013 | Kasza et al. .................. 361/605 |
| 2002/0171986 | A1 | | 11/2002 | Figueroa et al. |
| 2003/0035264 | A1 | * | 2/2003 | Hartel et al. .................. 361/678 |
| 2006/0012954 | A1 | * | 1/2006 | Jur et al. ........................ 361/695 |
| 2014/0118890 | A1 | * | 5/2014 | Kubota et al. ................. 361/637 |

\* cited by examiner

*Primary Examiner* — Michail V Datskovskiy

(57) ABSTRACT

A cabinet structure for a switchgear assembly. The cabinet structure includes a cabinet having upper and lower vents and a breaker cradle for holding a circuit breaker having primary disconnects for connecting the circuit breaker to bus bars. The cabinet further includes an air passageway located between the upper and lower vents, wherein the air passageway extends vertically through the primary disconnects and the cabinet. Further, the cabinet includes a fan module having at least one fan for drawing outside air through the lower vent, the air passageway and the primary disconnects for cooling the primary disconnects.

18 Claims, 8 Drawing Sheets

MODULAR DRAW OUT FAN MODULE WITH CHIMNEY DESIGN FOR COOLING COMPONENTS IN LOW VOLTAGE SWITCHGEAR

FIELD OF THE INVENTION

This invention relates to switchgear assemblies, and more particularly, to a cabinet structure that includes a power circuit breaker and a fan module for drawing cool outside air into the cabinet structure and through an air passageway that directs the air over the primary disconnects of the power circuit breaker to cool the power circuit breaker.

BACKGROUND OF THE INVENTION

Switchgear, switchboards, panel boards and other assemblies are general terms which cover metal enclosures or cabinets that house switching and interrupting devices such as fuses and circuit breakers along with associated control, instrumentation and metering devices. Such assemblies typically include buses, interconnections and supporting structures used for distribution of electric power. In addition, the assemblies are categorized as high, medium and low voltage switchgear and switchboards. Low voltage switchgear and switchboards operate at voltages up to 1000 volts and with continuous currents up to 6000 amperes. They are designed to withstand short-circuit currents up to 200,000 amperes.

Typical switchgear equipment includes a lineup of multiple metal enclosed sections. Each section may have several circuit breakers stacked one above the other vertically in the front of the section with each breaker being enclosed in its own metal compartment. Each section has a vertical or section bus which supplies current to the breakers within the section via short horizontal branch buses, also referred to as run-in buses, which extend through insulated openings in the rear wall of the breaker compartments. The vertical buses in each section are supplied with current by a horizontal main bus that runs through the line-up. The rear of the section is typically an open area for the routing of cables.

It has recently become desirable to provide low voltage switchgear with circuit breakers having 6000 ampere continuous current ratings. In order to comply with American National Standards Institute Standard C37.50 (ANSI standard), the temperature of the switchgear must be within a maximum temperature limit at 100% rated current. In accordance with the ANSI standard, the temperature is measured throughout the switchgear including the power circuit breakers. However, additional heat is generated in the switchgear due to the increase of circuit breaker current to 6000 amperes. In particular, since heat generation is directly proportional to the square of the current, the increase in current results in an increase of approximately 44% in the amount of heat that is generated at 100% rated current. However, the same temperature limits set forth in the ANSI standard have to be met without increasing the physical size of the power circuit breaker or the footprint of the switchgear. Currently available switchgear equipment is air cooled through natural convection by utilizing vents in the back and top of switchgear. However, it has been found that cooling by natural convention is not sufficient to accommodate the additional heat generated by the increased current.

SUMMARY OF THE INVENTION

A cabinet structure for a switchgear assembly is disclosed. The cabinet structure includes a cabinet having upper and lower vents and a breaker cradle for holding a circuit breaker having primary disconnects for connecting the circuit breaker to bus bars. The cabinet further includes an air passageway located between the upper and lower vents, wherein the air passageway extends vertically through the primary disconnects and the cabinet. Further, the cabinet includes a fan module having at least one fan for drawing outside air through the lower vent, the air passageway and the primary disconnects for cooling the primary disconnects.

DESCRIPTION OF THE INVENTION

Figure 1:
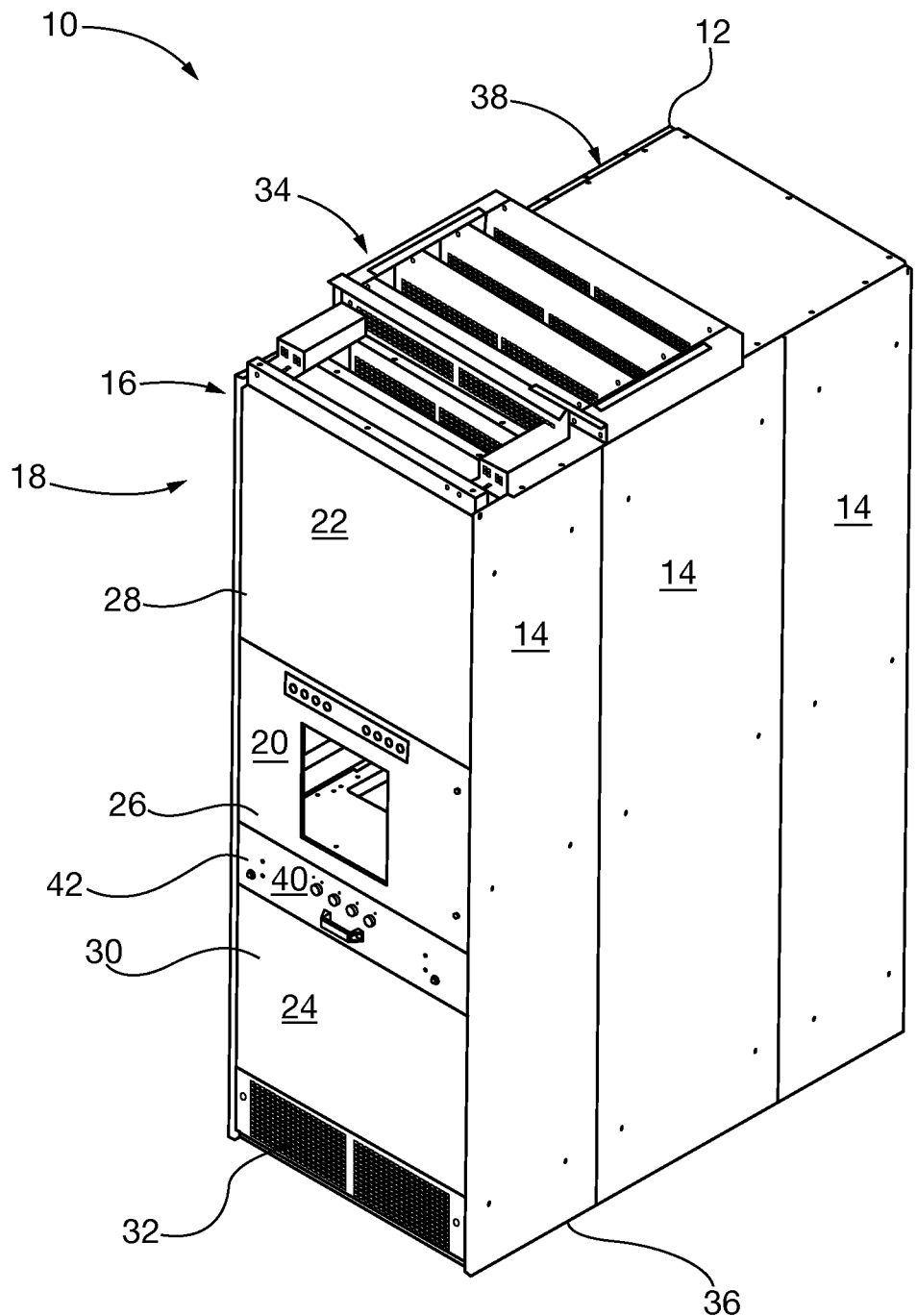
FIG. 1 is a perspective view of a switchgear assembly.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass direct and indirect mountings, connections, supports, and couplings. Further, "connected" and "coupled" are not restricted to physical or mechanical connections or couplings. In the description below, like reference numerals and labels are used to describe the same, similar or corresponding parts in the several views of FIGS. 1-7.

Referring to FIG. 1, a perspective view of a switchgear assembly 10 in accordance with the present invention is shown. In one embodiment, the switchgear assembly 10 is configured as a low voltage switchgear assembly having a continuous current rating of up to 6000 amperes. The switchgear assembly 10 includes a cabinet structure 12 having right 14 and left 16 side walls fabricated, for example, from sheet metal. The cabinet 12 also includes a front portion 18 having a circuit breaker compartment 20 located between upper 22 and lower 24 auxiliary compartments. The circuit breaker compartment 20 houses a circuit breaker suitable for low voltage switchgear and includes a compartment front panel 26. The upper 22 and lower 24 auxiliary compartments may house electronic components for use in the switchgear assembly 10. Access to the upper 22 and lower 24 auxiliary compartments is provided by upper 28 and lower 30 doors, respectively. The switchgear assembly 10 also includes inlet 32 and outlet vents configured as a vent stack 34 located in bottom 36 and top 38 portions, respectively, of the cabinet 12. A fan module 40 having a module front panel 42 is located between the circuit breaker compartment 20 and lower auxiliary compartment 24. The fan module 40 includes at least one fan for drawing air through the inlet vent 32 which then exits the cabinet 12 via the vent stack as will be described.

Figure 2:
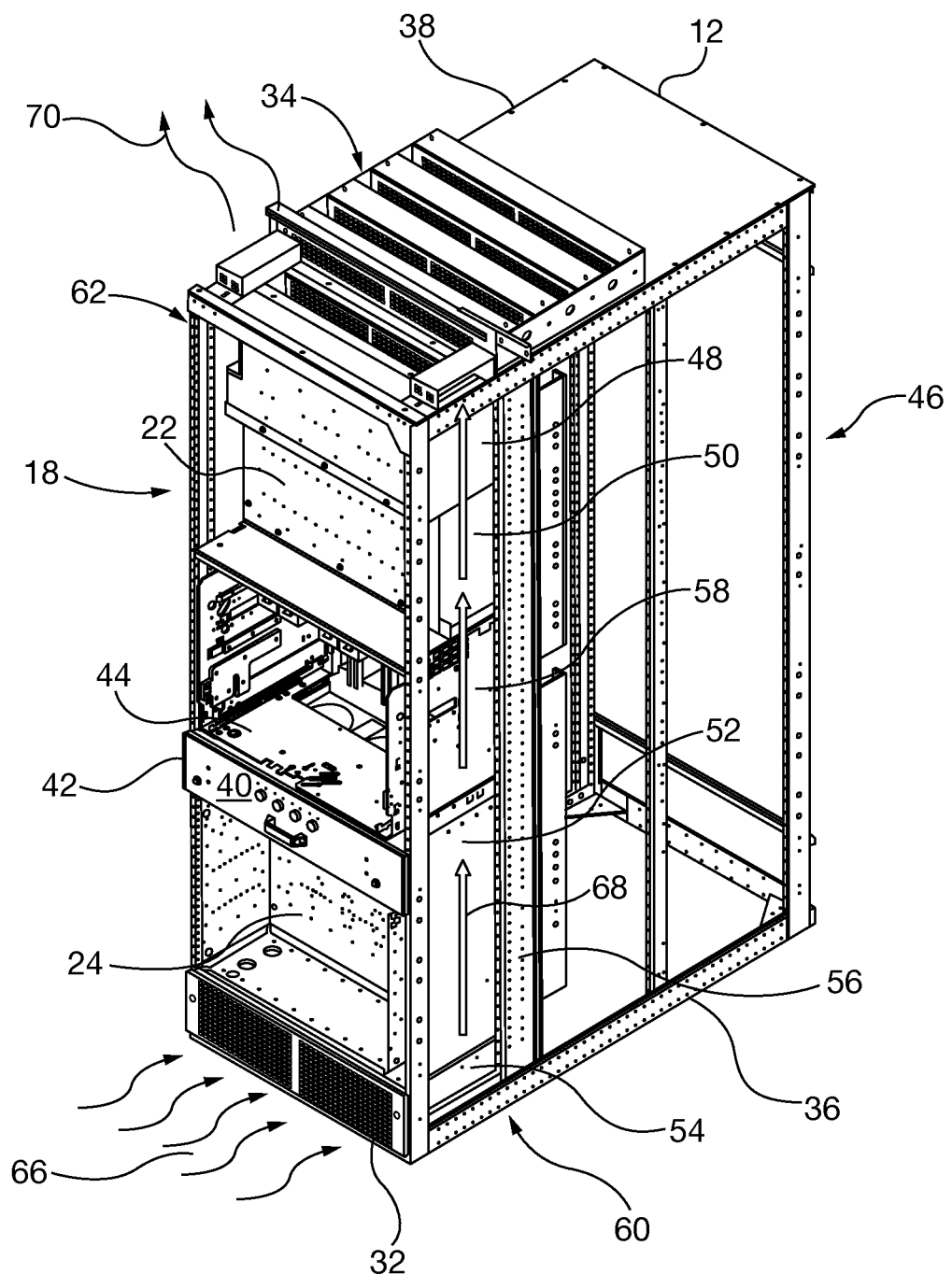
FIG. 2 is a perspective view of the cabinet with right side walls, upper and lower doors and a pull out section of the circuit breaker compartment are shown removed.
Figure 3:
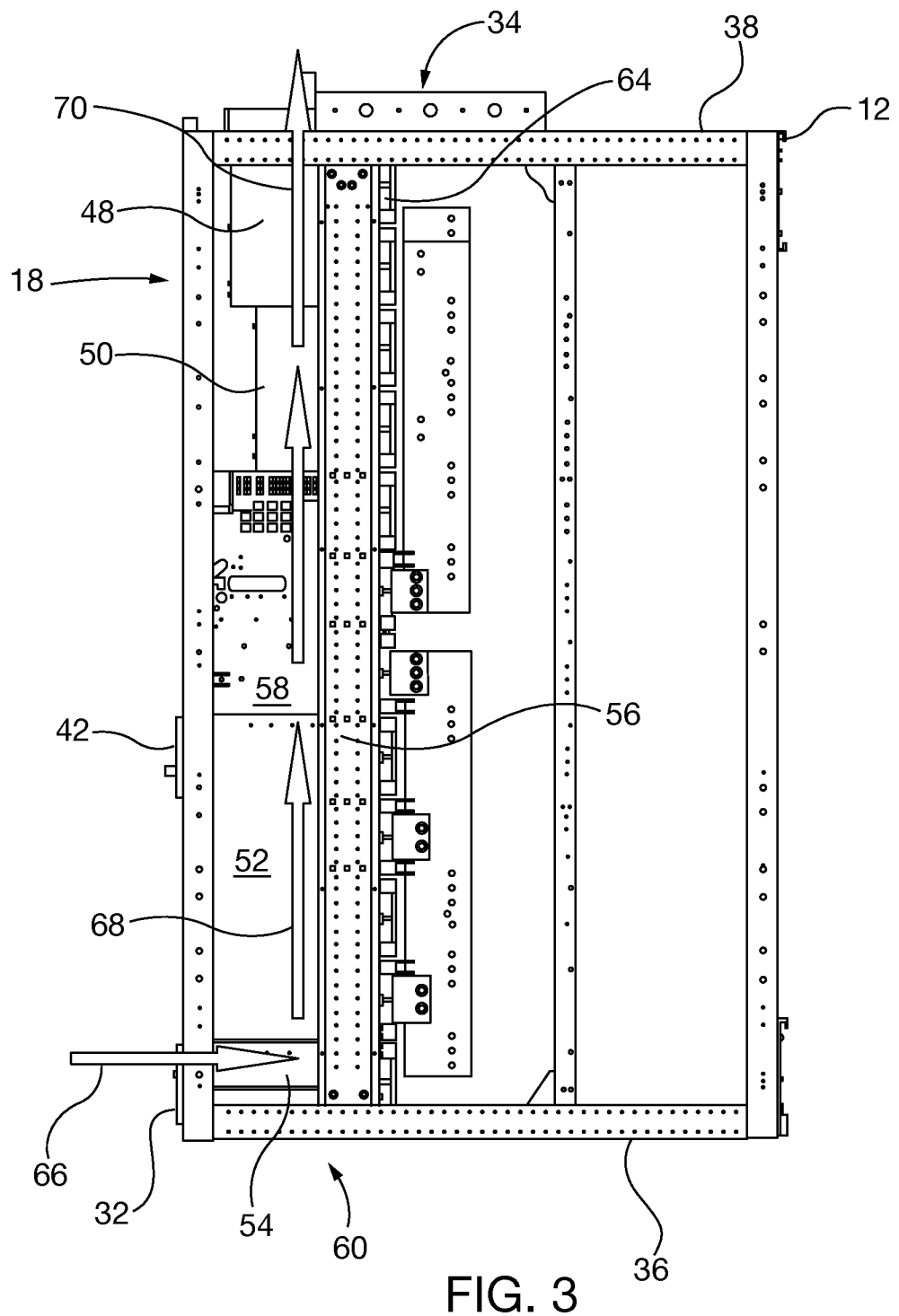
FIG. 3 is right side view of the cabinet with right side walls, upper and lower doors and a pull out section of the circuit breaker compartment are shown removed.

Referring to FIGS. 2 and 3, the cabinet 12 is shown with the right side walls 14 and upper 28 and lower 30 doors removed to reveal the upper 22 and lower 24 auxiliary compartments. In addition, a pull out section of the circuit breaker compartment 20 including the circuit breaker is shown removed to reveal a breaker cradle 44. A right side 46 of the cabinet 12 includes first 48, second 50, third 52 and fourth 54 duct sections which are oriented vertically and a right center post 56 adjacent the first 48, second 50, third 52 and fourth 54 duct sections. A right cradle wall 58 of the breaker cradle 44 is located between the second 50 and third 52 duct sections. The first 48, second 50, third 52 and fourth 54 duct sections, right center post 56, and right cradle wall 58 form a right duct section 60 that extends between the top 38 and bottom 36 portions of the cabinet 12. Similarly, a left side 62 of the cabinet also includes first, second, third and fourth duct sections, a left center post and a left cradle wall between the second and third duct sections to form a left duct portion that also extends between the top and bottom portions of the cabinet 12. The breaker cradle 44 is attached to a base portion that extends vertically between the top 38 and bottom 36 portions of the cabinet 12 and between the right 60 and left 35 duct portions to form a back wall 64. The fan module 40 includes at least one fan for drawing cool ambient air 66 through the inlet vent 32. The air is then pushed through the breaker cradle 44 to cool components in the breaker cradle 44 and ultimately exits as hot air 70 the through the vent stack 34. The path of the air flow is depicted by arrows 68 and is shown superimposed on the cabinet 12. Alternatively, air flows through the switchgear assembly 10 under natural convection when the fan is not operating to thus cool the switchgear assembly 10.

Figure 4:
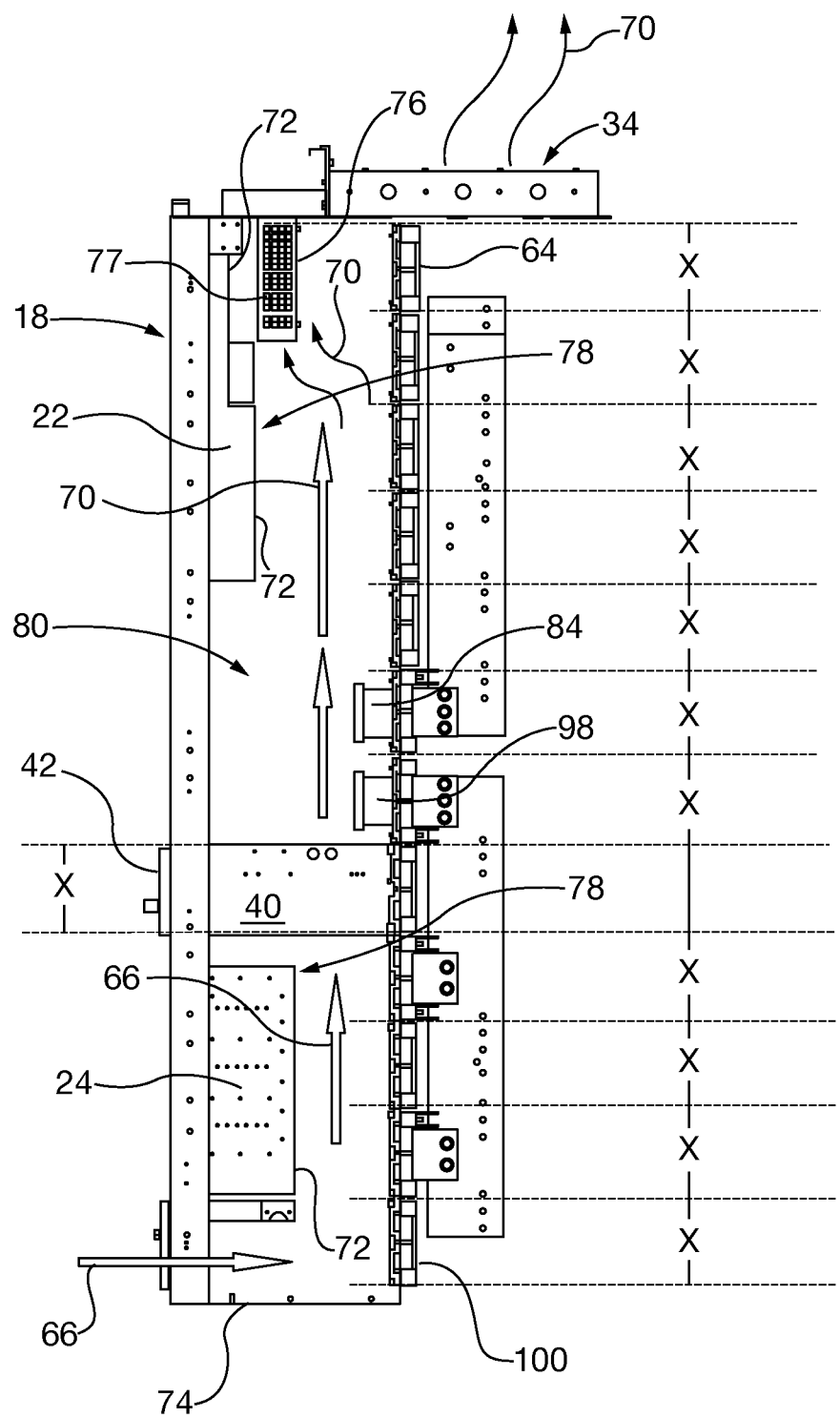
FIG. 4 is a partial right side view of the switchgear assembly wherein first, second, third and fourth duct sections, a right cradle wall, right center post and rear sections of the cabinet are shown removed.

Referring to FIG. 4, a partial right side view of the switchgear assembly is depicted wherein the first 48, second 50, third 52 and fourth 54 duct sections, right cradle wall 58, right center post 56 and rear sections of the cabinet 12 are shown removed. A rear portion 72 of the upper 22 and lower 24 auxiliary compartments along with compartment 26 and module 42 front panels form a front wall 78. The cabinet 12 further includes a bottom surface 74 and a vent box 76 extending from the vent stack 34. The vent box 76 may include four sides each having a side vent 77. The front 78 and back 64 walls, the bottom surface 74 and the right 60 and left duct sections form a chimney that defines an internal pathway 80 for the flow of air through the cabinet 12 that is used to cool the switchgear assembly 10. In particular, the fan in the fan module 40 draws cool air 66 in through the inlet vent 32 in a horizontal direction which is then directed upward by the back wall 64 and behind the lower auxiliary compartment 24 and through the fan module 40 and the breaker cradle 44. In one embodiment, the fan blows air on line and load side primary disconnects 82 of a circuit breaker 86 (see FIG. 5), which may be a power circuit breaker. In addition, the fan blows air on line 84 and load 98 side primary disconnects of the switchgear assembly 10. The air then draws heat from the line and load side primary disconnects 82 and the line 84 and load 98 primary disconnects thus cooling the line and load side primary disconnects 82 and the line 84 and load 98 primary disconnects and heating the air. Hot air 70 then travels upward behind the upper auxiliary compartment 22 and enters the vent box 76 from all four sides and also enters the vent stack 34 from below. The hot air 70 exits the switchgear assembly 10 through both vent box 76 and vent stack 34. Thus, the temperature of the switchgear assembly 10 is maintained within the limits set forth in ANSI standard C37.50.

Figure 5:
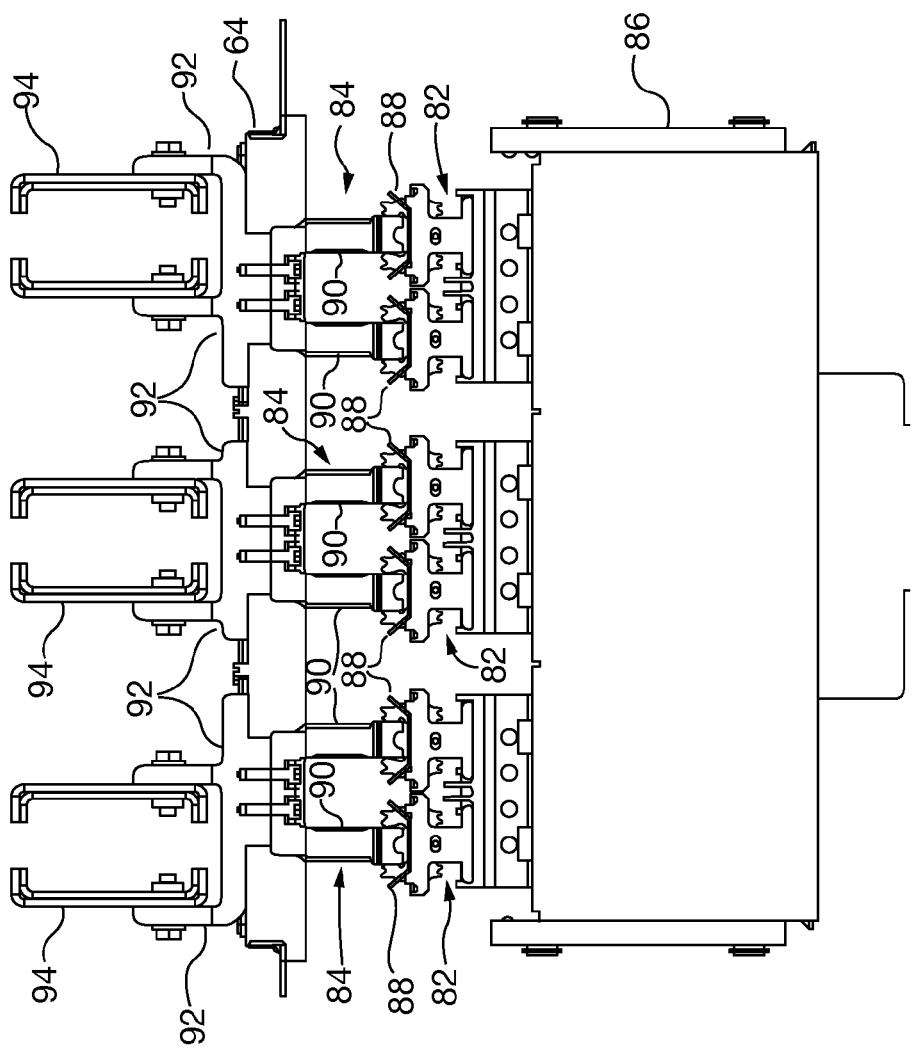
FIG. 5 depicts exemplary primary disconnects for the circuit breaker and primary disconnects for the switchgear assembly.

Referring to FIG. 5, exemplary primary disconnects 82 for the circuit breaker 86 and primary disconnects 84 for the switchgear assembly 10 are shown. Each primary disconnect 82 includes two pairs of finger clusters 88 associated with each phase of the circuit breaker 86. Each primary disconnect 84 includes a pair of stab tips 90 associated with each phase. Each finger cluster 88 receives a corresponding stab tip 90. Each pair of stab tips 90 is connected by a run-in 92 to a corresponding vertical bus 94. Each of the run-ins 92 extends through the back wall 64. Referring back to FIG. 4, the load side primary disconnects 98 are configured substantially similar to the line side primary disconnects 84.

Figure 4A:
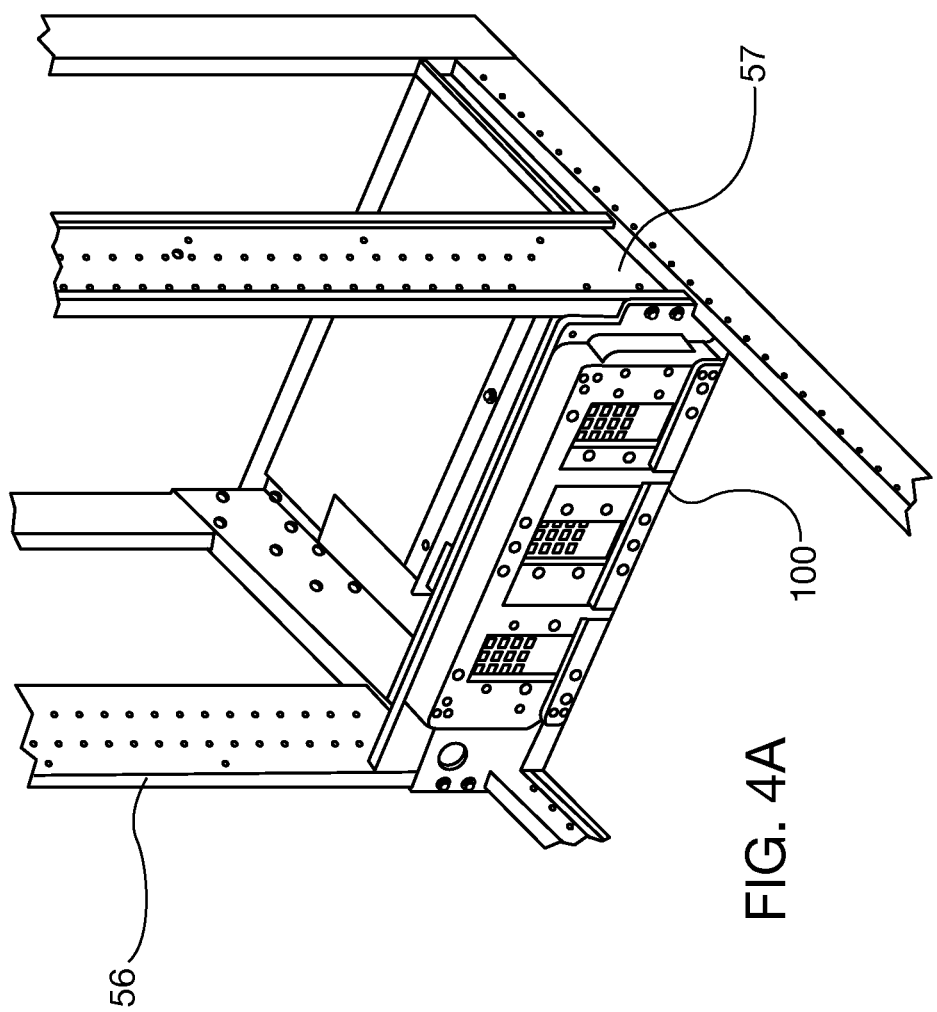
FIG. 4A is a view of an exemplary base portion shown attached between the right center post and a left center post.
Figure 6:
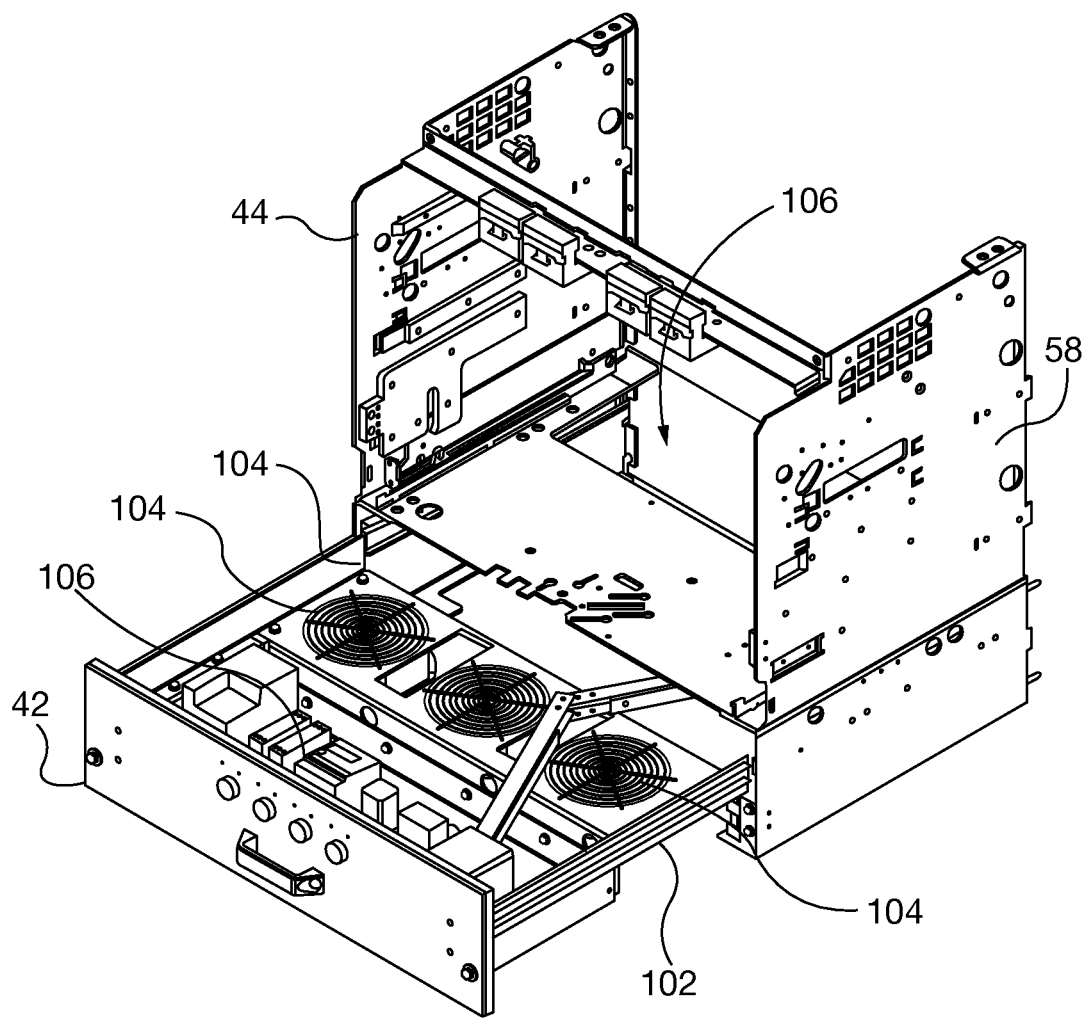
FIG. 6 depicts the fan module in an open position underneath the breaker cradle.

In one embodiment, the switchgear assembly 10 may have a modular design. In particular, the back wall 64 may be divided into a plurality of molded base portions 100 each having an identical height "X". Referring to FIG. 4A, an exemplary base portion 100 is shown attached between the right center post 56 and a left center post 57. By way of example, the fan module 40 and breaker cradle 44 may each be 1X high and 3X high, respectively, where X is approximately 7.50 inches. The modular design enables the fan module 40 to be attached to a corresponding molded base which is also 1X high. Alternatively, the fan module 40 may be attached under the breaker cradle 44 as a standalone unit as shown in FIG. 6. Thus, the same fan module 40 may be attached using alternate configurations.

Figure 7:
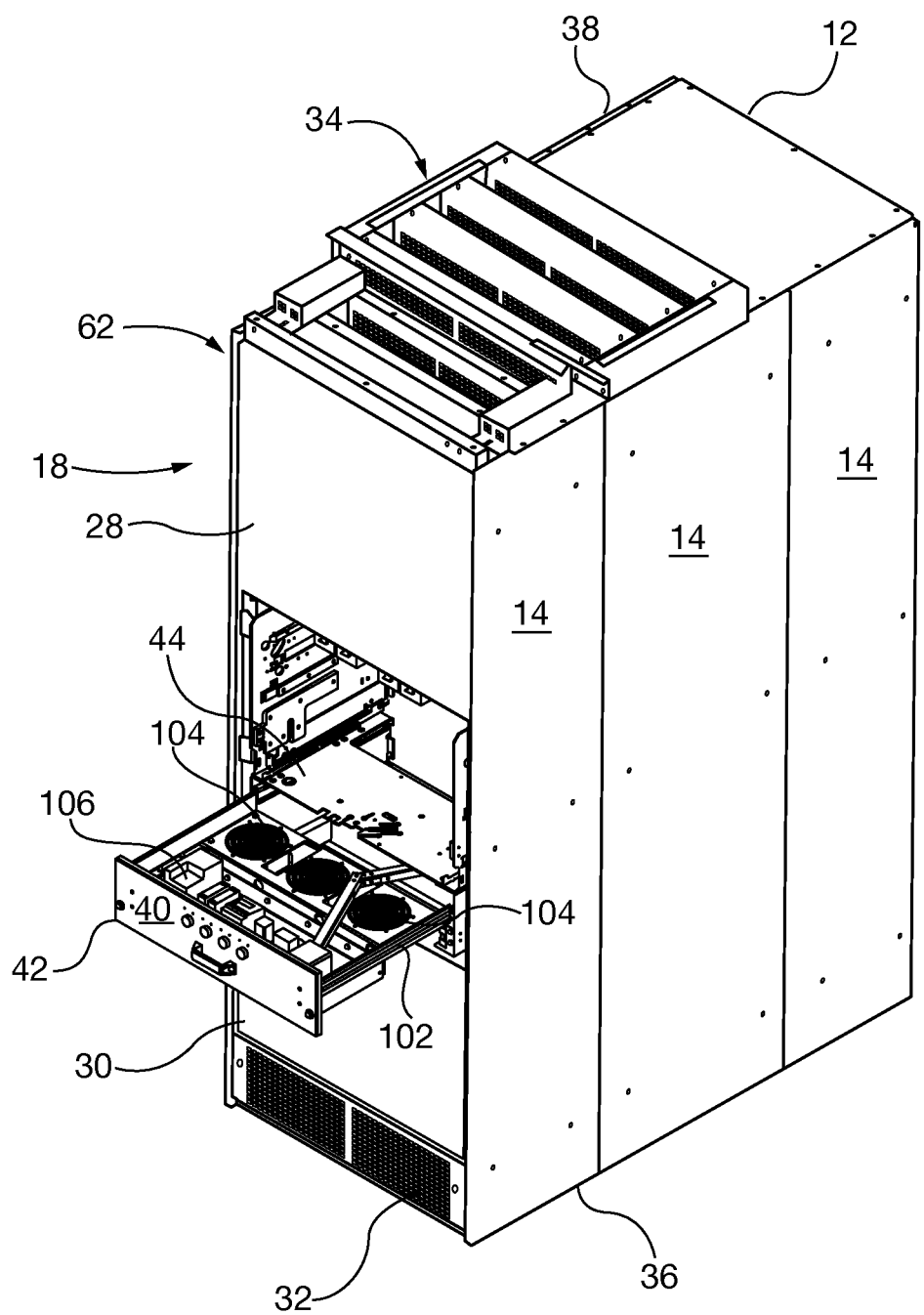
FIG. 7 depicts the switchgear assembly with the fan module in an open position.

Referring to FIGS. 6 and 7, the fan module 40 is shown in an open position. The fan module 40 may be mounted in a drawer configuration having slide assemblies 102 to enable opening or drawing of the fan module out of the cabinet 10 and closing of the fan module 40 in the cabinet 10. The fan module 40 includes at least one axial fan 104 which is powered by the switchgear assembly 10. The fan module 40 also includes a fan control circuit 106 which turns on the axial fan 104 when the current through the circuit breaker 86 exceeds a pre-set level. The axial fan 104 continues to operate until the current through the circuit breaker 86 decreases below the pre-set level. Alternatively, if more than one axial fan 104 is used, one or more of the axial fans 104 may be turned on or off as required to provide sufficient cooling or conserve power. The draw out design facilitates inspection, maintenance and replacement of the axial fan 104 and components as needed. In addition, the breaker cradle 44 includes a cutout portion 106 for facilitating the smooth flow of air which is being pushed by the axial fan 104.

In alternate embodiments, the fan module 40 may be located in other locations in the cabinet 12 such as above the breaker cradle 44. In addition, cooling tubes that include a refrigerant may be used in instead of, or in conjunction with, the fan module 40 to cool the air flowing through the cabinet. Further, the shape of the internal pathway or chimney may be configured to change the air flow in a desired manner to enhance cooling by, for example, varying the shape of either the upper 22 or lower 24 auxiliary compartments or adding other components to cause desired changes in air flow. The current invention may also be used in conjunction with circuit breakers having higher or lower current ratings. For example, it may be desirable to use the fan module 40 to cool a circuit breaker having a current rating of 3200 amperes that is actually being used at 4000 amperes, for example. This may occur when attempting to fit a circuit breaker in a narrower cross section, for example. In addition, the fan module 40 may be used to cool certain types of fused breakers and other devices.

While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations.

What is claimed is:

1. A cabinet structure for a switchgear assembly, comprising:
    a cabinet having upper and lower vents and upper and lower auxiliary compartments;
    a breaker cradle for holding a circuit breaker;
    an air passageway located between the upper and lower vents, wherein the air passageway extends through the breaker cradle and the cabinet; and
    a fan module having at least one fan for drawing outside air through the lower vent, the air passageway and the breaker cradle.

2. The cabinet structure according to claim 1, wherein the fan module is located beneath the breaker cradle.

3. The cabinet structure according to claim 1, wherein the air passageway includes a vent box connected to the upper vent.

4. The cabinet structure according to claim 1, wherein the fan module is moveable between open and closed positions.

5. The cabinet structure according to claim 1, wherein the fan is an axial fan.

6. The cabinet structure according to claim 1, further including a fan control circuit for turning on the fan when the current through the circuit breaker exceeds a predetermined level and for turning off the fan when the current decreases below the predetermined level.

7. The cabinet structure according to claim 1, wherein the switchgear assembly is a low voltage switch gear assembly having a continuous current rating of up to 6000 amperes.

8. The cabinet structure according to claim 1, wherein the air passageway is oriented vertically in the cabinet.

9. A cabinet structure for a switchgear assembly, comprising:
    a cabinet having upper and lower vents and upper and lower auxiliary compartments;
    a breaker cradle for holding a circuit breaker having primary disconnects for connecting to bus bars;
    an air passageway located between the upper and lower vents, wherein the air passageway extends vertically through the primary disconnects and the cabinet; and
    a fan module having at least one fan for drawing outside air through the lower vent, the air passageway and the primary disconnects.

10. The cabinet structure according to claim 9, wherein the fan module is located beneath the breaker cradle.

11. The cabinet structure according to claim 9, wherein the air passageway includes a vent box connected to the upper vent.

12. The cabinet structure according to claim 9, wherein the fan module is moveable between open and closed positions.

13. The cabinet structure according to claim 9, wherein the fan is an axial fan.

14. The cabinet structure according to claim 9, further including a fan control circuit for turning on the fan when the current through the circuit breaker exceeds a predetermined level and for turning off the fan when the current decreases below the predetermined level.

15. The cabinet structure according to claim 9, wherein the switchgear assembly is a low voltage switch gear assembly having a continuous current rating of up to 6000 amperes.

16. The cabinet structure according to claim 9, wherein the primary disconnects include stab tips.

17. The cabinet structure according to claim 9, wherein the primary disconnects include a plurality of fingers.

18. A method for cooling primary disconnects in a switchgear assembly, comprising the steps of:
    providing a cabinet having upper and lower vents and upper and lower auxiliary compartments;
    providing an air passageway located between the upper and lower vents, wherein the air passageway extends vertically through primary disconnects; and
    drawing air through the lower vent and forcing the air through the air passageway and the primary disconnects.

* * * * *